(12) United States Patent
Tai et al.

(10) Patent No.: US 9,143,033 B2
(45) Date of Patent: Sep. 22, 2015

(54) HYSTERETIC POWER CONVERTER WITH CALIBRATION CIRCUIT

(75) Inventors: Chia-Liang Tai, Shalu Township (TW); Alan Roth, Leander, TX (US); Eric Soenen, Austin, TX (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 274 days.

(21) Appl. No.: 12/956,630

(22) Filed: Nov. 30, 2010

(65) Prior Publication Data

US 2012/0133345 A1    May 31, 2012

(51) Int. Cl.
G05F 1/00    (2006.01)
H02M 3/156    (2006.01)
G05F 1/40    (2006.01)
G05F 1/10    (2006.01)

(52) U.S. Cl.
CPC ................. *H02M 3/156* (2013.01); *G05F 1/00* (2013.01); *G05F 1/10* (2013.01); *G05F 1/40* (2013.01)

(58) Field of Classification Search
CPC ..................................................... H02M 3/156
USPC ............ 363/56.02, 98, 16, 17; 323/282, 222, 323/259, 271, 280, 286, 344, 283, 284, 285, 323/288, 223, 234; 315/291, 294, 224, 306
See application file for complete search history.

(56) References Cited

U.S. PATENT DOCUMENTS

| | | | |
|---|---|---|---|
| 5,341,649 A * | 8/1994 | Nevitt et al. | ..................... 62/126 |
| 5,825,165 A | 10/1998 | Kitching et al. | |
| 6,518,738 B1 | 2/2003 | Wang | |
| 6,801,026 B2 | 10/2004 | Schrom et al. | |
| 6,906,499 B2 | 6/2005 | Hussein et al. | |
| 7,145,317 B1 | 12/2006 | Shah | |
| 7,199,563 B2 * | 4/2007 | Ikezawa | ......................... 323/266 |
| 7,227,763 B1 * | 6/2007 | Noh et al. | .................. 363/56.02 |
| 7,420,357 B2 | 9/2008 | Bayer | |
| 7,576,527 B1 | 8/2009 | Zhang et al. | |
| 7,646,177 B2 * | 1/2010 | Boerstler et al. | ............... 320/166 |
| 7,777,457 B2 * | 8/2010 | Haiplik | ......................... 323/222 |
| 2005/0017703 A1 * | 1/2005 | Walters et al. | ................ 323/288 |
| 2006/0202669 A1 | 9/2006 | Nishimori | |
| 2007/0035281 A1 * | 2/2007 | Kuroiwa et al. | .............. 323/222 |

(Continued)

FOREIGN PATENT DOCUMENTS

CN    101218735    7/2008
TW    200605477    2/2006

OTHER PUBLICATIONS

Abu-Qahouq, Jaber et al., "Multiphase Voltage-Mode Hysteretic Controlled DC-DC Converter with Novel Current Sharing", IEEE Transactions on Power Electronics, vol. 19, No. 6, Nov. 2004.

(Continued)

*Primary Examiner* — Matthew Nguyen
*Assistant Examiner* — Trinh Dang
(74) *Attorney, Agent, or Firm* — Lowe Hauptman & Ham, LLP

(57) ABSTRACT

A hysteretic power converter includes a comparator, a calibration circuit, and an output node having an output voltage. The calibration circuit is configured to supply a calibrated voltage to the comparator. The comparator controls the output voltage based on the calibrated voltage and a feedback voltage representing at least a portion of the output voltage.

20 Claims, 6 Drawing Sheets

(56) References Cited

U.S. PATENT DOCUMENTS

| | | | |
|---|---|---|---|
| 2008/0030178 A1* | 2/2008 | Leonard et al. | 323/282 |
| 2008/0042633 A1 | 2/2008 | Klein | |
| 2008/0067993 A1* | 3/2008 | Coleman | 323/282 |
| 2009/0112555 A1 | 4/2009 | Boerstler et al. | |
| 2009/0273290 A1* | 11/2009 | Ziegenfuss | 315/193 |
| 2010/0026259 A1* | 2/2010 | Ozaki et al. | 323/282 |
| 2010/0052771 A1* | 3/2010 | Hartono | 327/536 |
| 2010/0079088 A1* | 4/2010 | Lipcsei et al. | 315/297 |
| 2010/0164579 A1* | 7/2010 | Acatrinei | 327/172 |
| 2010/0244801 A1 | 9/2010 | Arora et al. | |
| 2010/0289468 A1* | 11/2010 | Draghi et al. | 323/282 |
| 2012/0062144 A1* | 3/2012 | Yao et al. | 315/294 |
| 2012/0274228 A1* | 11/2012 | Szczeszynski | 315/224 |

OTHER PUBLICATIONS

Office Action dated Jan. 16, 2014 from corresponding application No. TW 100139172.

Office Action with English Translation from corresponding application No. DE 10 2011 012 830.1, Sep. 27, 2012.

Office Action from corresponding applicatin No. KR 10-2011-0049105, Dec. 17, 2012.

* cited by examiner

HYSTERETIC POWER CONVERTER WITH CALIBRATION CIRCUIT

TECHNICAL FIELD

The present disclosure relates generally to a power converter, and more particularly to a hysteretic power converter.

BACKGROUND

A power converter, e.g., a direct current (DC) to DC converter, is utilized in many electrical circuit applications, e.g., a Light Emitting Diode (LED) driver circuit. A DC-DC converter includes a hysteretic comparator with a reference voltage as one of its inputs. A controlled voltage of the converter is compared to hysteretic levels, and a high-side switch is turned on if the controlled voltage level is lower than a low threshold point while a low-side switch is turned on if the controlled voltage level is higher than a high threshold point.

However, a conventional DC-DC converter suffers an output offset problem that causes an output current inaccuracy, because of the response time of the hysteretic comparator and/or a loop delay. In an integrated circuit, the current inaccuracy problem becomes worse over process, voltage, and temperature (PVT) variations. For example, the controlled voltage of the converter is supposed to have an average level between two hysteretic threshold points, assuming that the high-side or low-side switch activates immediately when the controlled voltage level crosses a corresponding threshold point.

In a real comparator circuit, there is a response time for the switching action, which causes equivalent threshold levels to deviate. The deviation levels depend on the slew-rate rate of inputs to the comparator as well as PVT. The overall loop delay from output of the comparator corresponding to respective high/low side switching also causes the threshold levels vary with PVT variations. The threshold variation causes inaccuracy of controlled voltage and current.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1A:
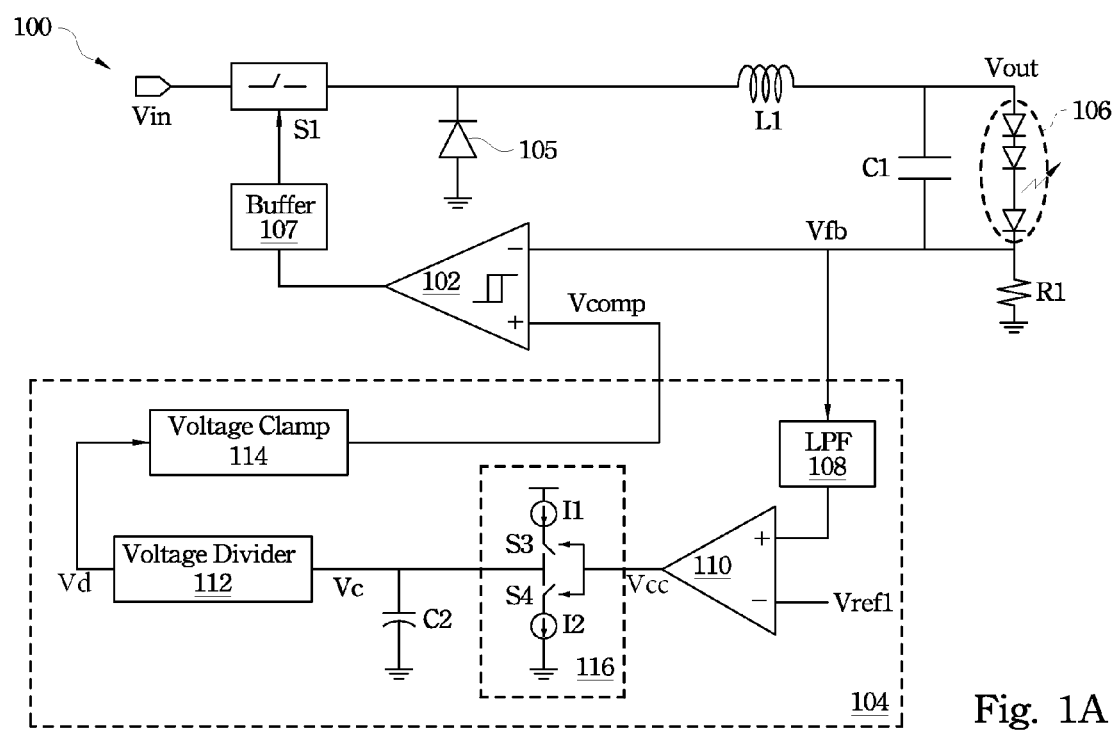
FIG. 1A is a schematic diagram showing an exemplary hysteretic power converter (buck converter) with a calibration circuit according to some embodiments.

FIG. 1A is a schematic diagram showing an exemplary hysteretic power converter (buck converter) with a calibration circuit according to some embodiments. The hysteretic power converter 100 includes a hysteretic comparator 102, a calibration circuit 104, a switches S1, a diode 105, an inductor L1, a capacitor C1, a load 106, e.g., light emitting diodes (LEDs), a buffer 107, and a resistor R1. The resistor R1 determines the current level of the load 106. Even though the hysteretic power converter 100 is used as a driver for LEDS in FIG. 1A, different applications for the hysteretic power converter 100 can have different load 106 other than LEDs.

The calibration circuit 104 receives a controlled voltage Vfb (i.e., to control the current of the load 106) as an input and supplies a calibrated voltage Vcomp to the positive terminal of the hysteretic comparator 102 as a variable reference level. The negative terminal of the hysteretic comparator 102 receives Vfb input. The calibration circuit 104 includes a low pass filter (LPF) 108, a comparator 110, a charge pump 116, a capacitor C2, a voltage divider 112, and a voltage clamp 114, and provides the dynamic adjustment of Vcomp. The charge pump 116 includes switches S3 and S4, and current sources I1 and I2. The LPF 108 averages Vfb by filtering high frequency components in the controlled voltage Vfb, which is then compared with Vref1, i.e., the target voltage in the comparator 110. The LPF 108 can be, for example, a resistor-capacitor (RC) filter. The comparator 110 does not have hysteresis, and can be implemented using an op-amp, for example.

As the difference between Vcomp and Vfb, e.g., (Vcomp−Vfb), reaches a high hysteretic threshold level (Vref_high, positive value) or a low hysteretic threshold level (Vref_low, negative value) of the hysteretic comparator 102, i.e. Vfb reaches a low threshold point of (Vcomp-Vref_high), or a high threshold point of (Vcomp-Vref_low) respectively, the switch S1 (and the diode 105) are controlled to keep the Vout and the current through the load 106 at a predetermined level. In one exemplary hysteretic comparator 102, if (Vcomp−Vfb) becomes higher than Vref_high, its output becomes a logical 1. Likewise, if (Vcomp−Vfb) becomes lower than Vref_low, its output becomes a logical 0. The hysteretic comparator 102 output controls the switch S1 (and the diode 105).

For example, if Vcomp minus Vfb is higher than the high hysteretic threshold level (Vref_high), S1 is turned on. When the switch S1 is turned on, a voltage level of Vin is supplied to the inductor L1, the diode 105 is reverse-biased (turned off), and the current through the inductor L1 increases, which also increases Vfb. Thus, if (Vcomp−Vfb) is higher than Vref_high (i.e., Vfb is lower than a low threshold point Vfb_low=Vcomp−Vref_high), Vfb is increased.

If Vcomp minus Vfb is lower than the low hysteretic threshold level (Vref_low), the switch S1 is turned off. When the switch S1 is turned off, a voltage level of Vin is no longer supplied to the inductor L1, the diode 105 is forward-biased (turned on), and the current through the inductor L1 decreases, which also decreases Vfb. The diode 105 functions as a complement switch of the switch S1. Thus, if (Vcomp−Vfb) is lower than Vref_low (i.e., Vfb is higher than a high threshold point Vfb_high=Vcomp−Vref_low), Vfb is decreased.

The comparator 110 of the calibration circuit 104 compares an averaged controlled voltage Vfb (via the low pass filter 108) with a preset target voltage (Vref1) and controls switches S3 and S4. If the averaged controlled voltage Vfb is less than preset voltage the Vref1, the output of the comparator 110 outputs a signal Vcc to the charge pump 116 to close switch S3 (and open switch S4), which increase the voltage Vc of the charge capacitor C2. The Vc passes through a voltage divider 112 and a voltage clamp circuit 114 to supply the divided voltage Vd of Vc as voltage Vcomp to the positive terminal of the hysteretic comparator 102 with a higher level of Vcomp than its previous value. The voltage clamp 114 limits the Vcomp value so that Vcomp does not exceed a predetermined maximum value, e.g., when the hysteretic power converter 100 is at its initial stage starting up.

With the higher Vcomp level, Vfb connected to the negative terminal of the hysteretic comparator 102 swings around a higher reference level of Vcomp in its hysteretic behavior. Thus, the calibration circuit 104 provides a feedback function by adjusting the level of Vcomp based on averaged Vfb compared to Vref1, and compensates a decrease of the averaged controlled voltage Vfb.

Likewise, if the averaged controlled voltage Vfb is greater than the preset voltage Vref1, the output of the comparator 110 outputs a signal Vcc to the charge pump 116 to close switch S4 (and open switch S3), which decreases the voltage Vc of the charge capacitor C2. The Vc passes through a voltage divider 112 and a voltage clamp circuit 114 to supply the divided voltage Vd of Vc as voltage Vcomp to the positive terminal of the hysteretic comparator 102 with a lower level of Vcomp than its previous value. With the lower Vcomp level, Vfb connected to the negative terminal of the hysteretic comparator 102 swings around a lower reference level of Vcomp in its hysteretic behavior. Thus, the calibration circuit 104 provides a feedback function by adjusting the level of Vcomp based on Vfb compared to Vref1, and compensates an increase of the averaged controlled voltage Vfb, by discharging the capacitor voltage Vc and coming to a lower Vcomp at the hysteretic comparator 102.

While Vcomp is calibrated by the calibration circuit 104 as described above, high and low threshold points of the hysteretic comparator 102, i.e., (Vcomp-Vref_low) and (Vcomp-Vref_high), are formed through a hysteretic window around Vcomp from the perspective of Vfb. That means that Vfb swings around both high/low threshold points that are variable and calibrated based on Vcomp, in order to maintain the averaged Vfb equal to the preset value Vref1.

The dynamic and continuous feedback of Vfb to Vcomp by the calibration circuit 104 compensates the offset of threshold points of the hysteretic comparator 102 that may result from variations of response time and loop delay because of the variations of PVT, so that Vfb (that is a portion of the Vout) is controlled to a well-defined/controlled preset value. Thus, the average load current supplied to the load 106 are maintained at a preset value accurately across PVT. For example, without the calibration circuit 104, a lower than expected averaged Vfb and load current (or Vout) value can result from response time and loop delay variations. The controlled current error at the load 106 is well controlled below 1% variation throughout a given range of PVT variations (e.g., various process corners at temperature of −40 to 125° C.), compared to 20% error by another circuit without the calibration circuit 104 under the same operating conditions.

The hysteretic power converter 100 has a fast response to variations of Vfb (or load current) by fast comparison from the comparator 110, as well as current-mode charging/discharging of the charge pump 116. Also, the calibration circuit 104 is compact, thus incurs almost no penalty of chip area. Furthermore, the hysteretic power converter 100 does not have significant adverse effects on power consumption, or efficiency compared to a conventional power converter.

A flexible design can be used in the hysteretic power converter 100, e.g., to control its charging speed, response time (bandwidth), and voltage swing range, etc. For example, if Vref1 is 200 mV, Vcomp may be at some range larger than 200 mV, e.g., 250 mV for a proper operation in some applications with conversion duty cycle larger than 50%. With the voltage divider 112 having a divide value of about ⅕, voltage Vc would be 250 mV×5=1.25 V, so that Vc can be operated in a suitable voltage (e.g., around half of the supply voltage in the charge pump 116) for a convenient design of the current sources I1 and/or I2.

Figure 1B:
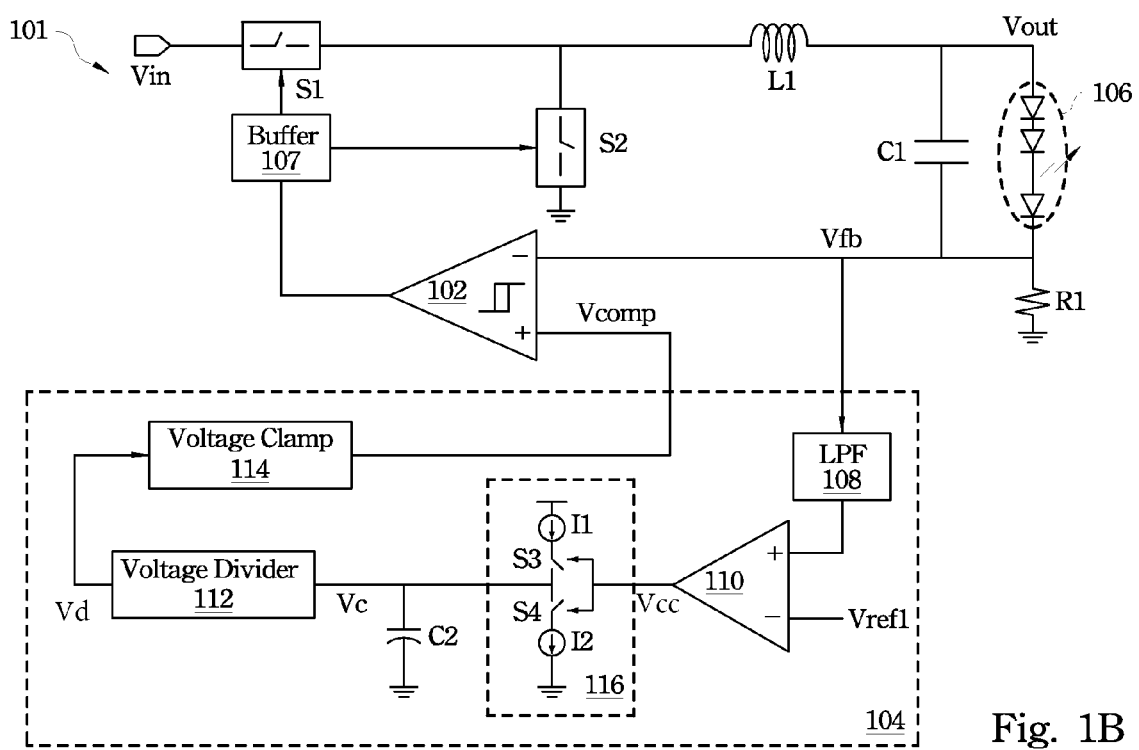
FIG. 1B is a schematic diagram showing another exemplary hysteretic power converter (buck converter) with a calibration circuit according to some embodiments.

FIG. 1B is a schematic diagram showing another exemplary hysteretic power converter (buck converter) with a calibration circuit according to some embodiments. The hysteretic power converter 101 is implemented using a switch S2 in place of the diode 105 in FIG. 1A. In the hysteretic power converter 101, the hysteretic comparator 102 controls the switches S1 and S2 based on the comparison of the Vcomp and Vfb. As the difference between Vcomp and Vfb, i.e., (Vcomp-Vfb), reaches a high or low hysteretic threshold level of the hysteretic comparator 102 (Vref_high or Vref_low), the switches S1 and S2 are controlled to keep the Vout and the current through the load 106 at a predetermined level.

For example, if Vcomp minus Vfb is higher than the high hysteretic threshold level 1 (Vref_high), S1 is turned on (and S2 is turned off). When S1 is turned on, i.e., closed (and S2 is open), the current through the inductor L1 increases, which also increases Vfb. If Vcomp minus Vfb is lower than the low hysteretic threshold level (Vref_low), S1 is turned off (and S2 is turned on). When S1 is turned off, i.e., open (and S2 is closed), the current through the inductor L1 decreases, which also decreases Vfb. The resistor R1 determines the current level of the load 106. The function of the calibration circuit 104 in the hysteretic power converter 101 is similar to the circuit in FIG. 1A as described above.

Figure 2:
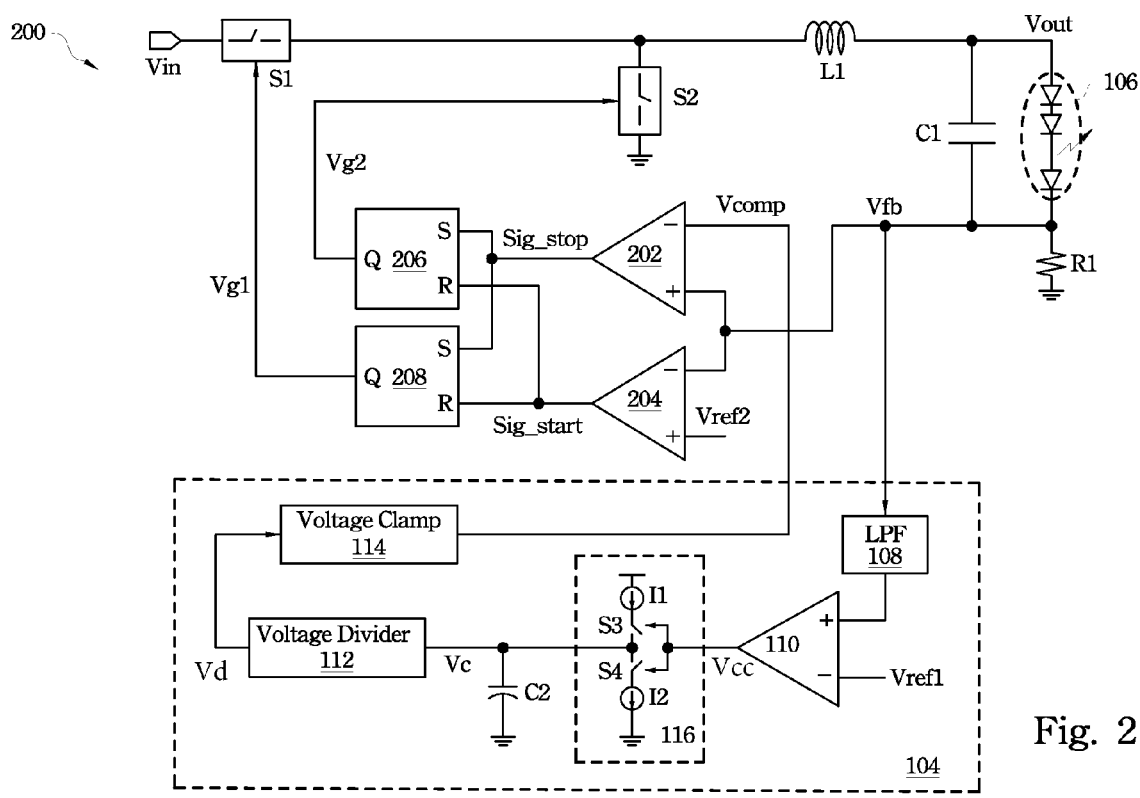
FIG. 2 is a schematic diagram showing yet another exemplary hysteretic power converter (buck converter) with a calibration circuit according to some embodiments.

FIG. 2 is a schematic diagram showing yet another exemplary hysteretic power converter (buck converter) with a calibration circuit according to some embodiments. In the hysteretic power converters 100 and 101 of FIG. 1A and FIG. 1B, the hysteretic comparator 102 has the high and low hysteretic threshold level (Vref_high and Vref_low) based on the difference between Vcomp and Vfb. Vfb, that are variable and calibrated based on Vcomp, swing around both (Vcomp-Vref_high) and (Vcomp-Vref_low) in order to maintain the averaged Vfb equal to the preset value Vref1.

In comparison, for the hysteretic power converter 200, the two comparators 202 and 204 are non-hysteretic comparators. The calibrated Vcomp supplied to the negative terminal of the comparator 202 functions as a high threshold point in the hysteretic power converter 200. A reference voltage Vref2 is supplied to the positive terminal of the comparator 204 and functions as a low threshold point in the hysteretic power converter 200. The Vref2 is fixed to a preset value, e.g., 150 mV.

The output of the comparator 202 is a signal Sig_stop that enables the switch S2 via a SR-latch 206. The output of the comparator 204 is a signal Sig_start, which enables the switch S1 via a SR-latch 208. For example, if Vfb has a higher level than Vcomp, the Sig_stop signal is a logical 1 (high), while the Sig_start signal is a logical 0 (low). The output Vg2 of the SR-latch 206 would be a logical 1 (high) to turn on the switch S2 and the output Vg1 of the SR-latch 208 would be a logical 0 (low) to turn off the switch 51, respectively. This decreases the level of Vfb. Likewise, if Vfb has a lower level than Vref2, then the opposite of the above happens to increase the level of Vfb. In another embodiment, a similar calibration/dynamic adjustment can be implemented by supplying the calibrated voltage Vcomp to the comparator 204 instead of Vref2, and supplying another reference voltage Vref3 to the comparator 202 instead of Vcomp.

Figure 3:
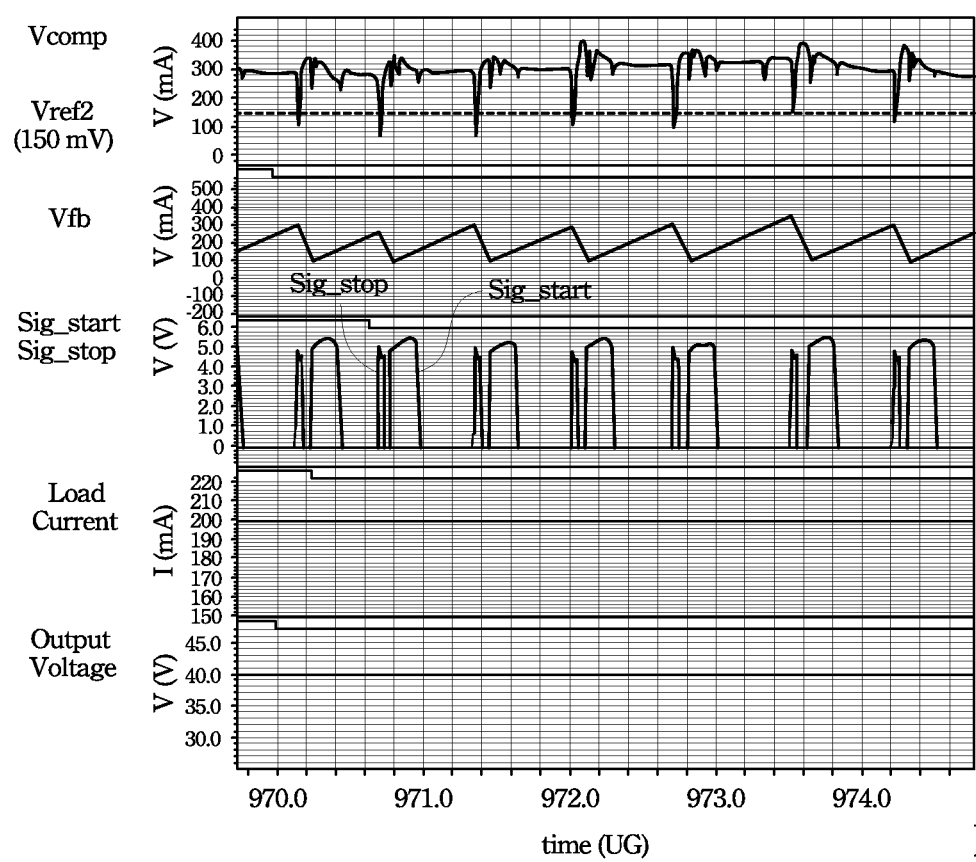
FIG. 3 is a plot showing waveforms of the exemplary hysteretic power converter (buck converter) in FIG. 2 with a calibration circuit according to some embodiments.

FIG. 3 is a plot showing waveforms of the exemplary hysteretic power converter (buck converter) in FIG. 2 with a calibration circuit according to some embodiments. In this example, Vin=48 V, target Vout=40 V, duty cycle=83% (duty cycle is the time ratio of when the switch S1 is turned on compared to one cycle time), target load (e.g., LED) current=200 mA. Vref1 was set at 200 mV, while Vref2 was set at 150 mV.

Sig_start and Sig_stop waveforms show when the switches S1 and S2 are enabled or disabled. A Vcomp waveform in FIG. 3 shows that Vcomp is continuously calibrated to about 300 mV so that VFB swing by two referenced levels, i.e., 150 mV and 300 mV, to have an averaged 200 mV Vfb despite response time and loop delay variations. The load current waveform shows that the load current is maintained at about 200 mV, while the output voltage (Vout) waveform shows that Vout is maintained at about 40 V.

For a conventional circuit without the calibration circuit 104, the current error was 10%~20% throughout a given range of PVT variations. For example, in one conventional circuit with the target load current at 200 mV, the load current was 175 mA, or showed 12.5% error. In comparison, one exemplary hysteretic power converter using the calibration circuit 104 showed 1% or less error under the same operating conditions. Also, in one example of the LED driver application, the hysteretic power converter with the calibration circuit 104 performed well when applied to a dimming function (reduced duty cycle). For example, when the duty cycle was 10%, the current accuracy was within 0.25% of the target load current of 20 mA.

Figure 4:
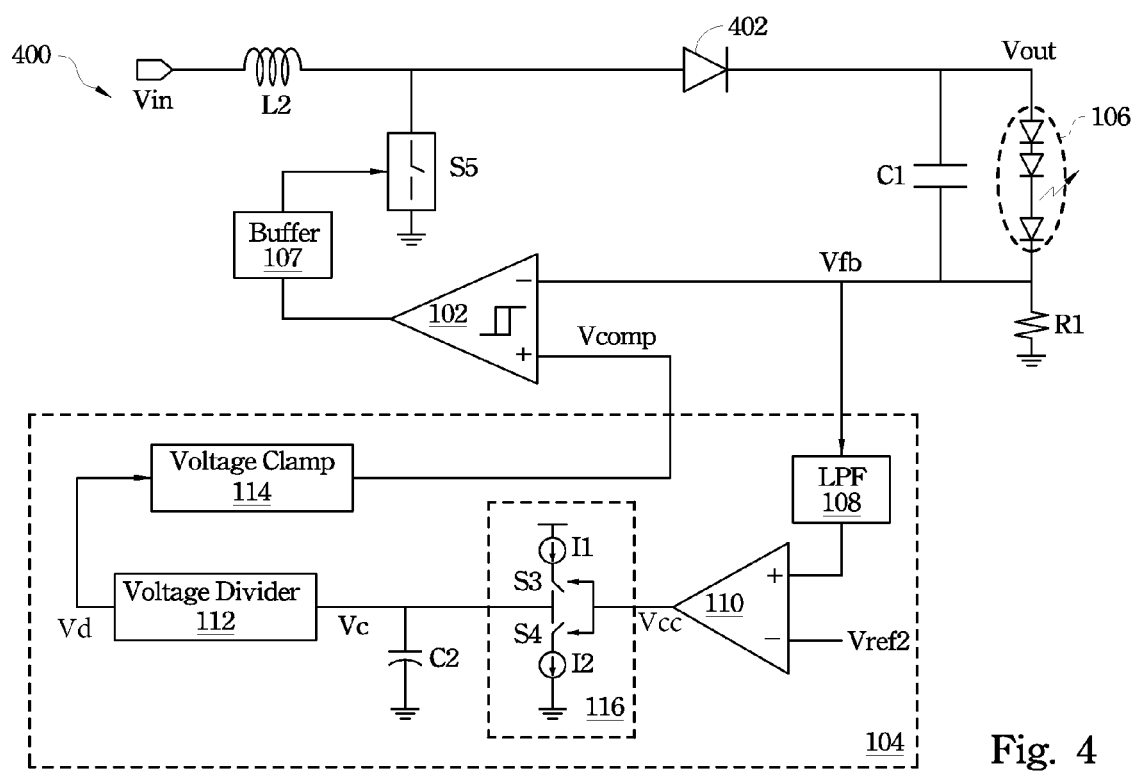
FIG. 4 is a schematic diagram showing yet another exemplary hysteretic power converter (boost converter) with a calibration circuit according to some embodiments.

FIG. 4 is a schematic diagram showing yet another exemplary hysteretic power converter (boost converter) with a calibration circuit according to some embodiments. The hysteretic power converter 400 is a boost converter, instead of the buck converters in FIG. 1A, FIG. 1B, and/or FIG. 2. The boost converter 400 includes an inductor L2, a switch S5, and a diode 402. When the switch S5 is closed, the current through the inductor L2 increases. When S5 is open, the inductor current flows through the load 106, and Vfb decreases. The calibration circuit 104 functions similarly as described above for the hysteretic power converter 100 (a buck converter) in FIG. 1A.

Figure 5:
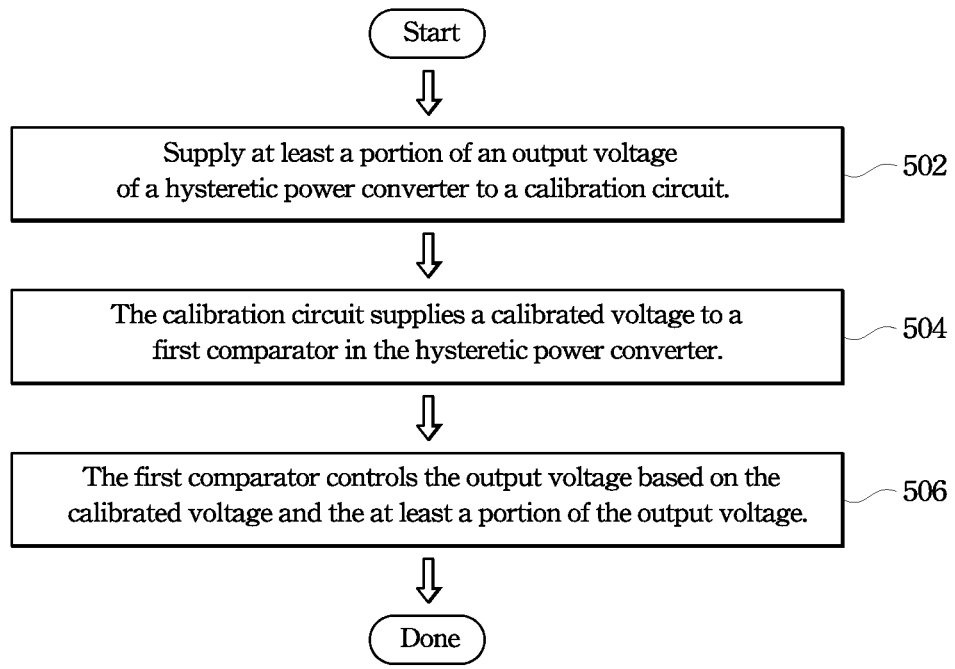
FIG. 5 is a flowchart of a method of controlling a power converter, such as one of the exemplary hysteretic power converters in FIG. 1A, FIG. 1B, FIG. 2, and/or FIG. 4 according to some embodiments.

FIG. 5 is a flowchart of a method of controlling a power converter, such as one of the exemplary hysteretic power converters in FIG. 1A, FIG. 1B, FIG. 2, and/or FIG. 4 according to some embodiments. At step 502, a feedback voltage representing at least a portion of an output voltage, e.g., Vfb, of the power converter, e.g., 100, 101, 200, or 400, is supplied to a calibration circuit, e.g., 104. At step 504, the calibration circuit, e.g., 104, supplies a calibrated voltage, e.g., Vcomp, to a first comparator, e.g., 102 or 202, in the hysteretic power converter, e.g., 100, 101, 200, or 400. At step 506, the first comparator, e.g., 102 or 202, controls the output voltage, e.g., Vout, based on the calibrated voltage, e.g., Vcomp, and the at least a portion of the output voltage, e.g., Vcomp.

In various embodiments, a second comparator, e.g., 110, in the calibration circuit, e.g., 104, receives the feedback voltage, e.g., Vfb. The comparator, e.g., 110, compares the feedback voltage, e.g., Vfb, to a first reference voltage, Vref1. The second comparator, e.g., 110, supplies a calibration comparator output Vcc. The calibration comparator output controls a charge pump, e.g., 116, in the calibration circuit, e.g., 104. The charge pump, e.g., 116, supplies the calibrated voltage, e.g., Vcomp.

In various embodiments, a voltage divider, e.g., 112, in the calibration circuit, e.g., 104, divides an output voltage, e.g., Vc, from the charge pump, e.g., 116. The divided output Vd is supplied as the calibrated voltage, e.g., Vcomp. A voltage clamp, e.g., 114, in the calibration circuit, e.g., 104, limits the calibrated voltage, e.g., Vcomp. A low pass filter, e.g., 108, in the calibration circuit, e.g., 104, averages the feedback voltage, e.g., Vfb.

In various embodiments, a third comparator, e.g., 204, receiving a second reference voltage, e.g., Vref2, and the third comparator, e.g., 204, and the first comparator, e.g., 202, controls the output voltage, e.g., Vout, based on the calibrated voltage, e.g., Vcomp, the feedback voltage, e.g., Vfb, and the second reference voltage, e.g., Vref2.

According to some embodiments, a hysteretic power converter includes a comparator, a calibration circuit, and an output node having an output voltage. A feedback voltage representing at least a portion of the output voltage is arranged to be coupled to the calibration circuit. The calibration circuit is configured to supply a calibrated voltage to the comparator. The comparator controls the output voltage based on the calibrated voltage and the feedback voltage.

According to some embodiments, a method for a hysteretic power converter includes supplying a feedback voltage representing at least a portion of an output voltage of the hysteretic power converter to a calibration circuit. The calibration circuit supplies a calibrated voltage to a comparator in the hysteretic power converter. The comparator controls the output voltage based on the calibrated voltage and the feedback voltage.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, methods and steps described in the specification. As one of ordinary skill in the art will readily appreciate from the disclosed embodiments, processes, machines, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A hysteretic power converter, comprising:
   a first comparator which is a hysteretic comparator;
   a calibration circuit;
   an output node arranged to have an output voltage at a first load terminal; and
   a capacitor coupled to the first load terminal and a second load terminal;
   wherein
   the calibration circuit is configured to supply a calibrated voltage to the first comparator, the first comparator has
a first input configured to receive, from a feedback node, a feedback voltage representing at least a portion of the output voltage, wherein the feedback node is coupled to the second load terminal, and
a second input coupled to the calibration circuit to receive the calibrated voltage,
the calibration circuit is configured to supply the calibrated voltage processed from the feedback voltage, and
the first comparator is configured to generate, in response to a difference between the calibrated voltage processed from the feedback voltage and the feedback voltage, an output signal at a logic 1 or a logic 0 for controlling the output voltage.

2. The hysteretic power converter of claim 1, wherein the calibration circuit comprises:
a second comparator configured to receive the feedback voltage, compare the feedback voltage with a first reference voltage, and provide a calibration comparator output; and
a charge pump,
wherein the calibration comparator output is arranged to control the charge pump, and the charge pump is configured to supply the calibrated voltage.

3. The hysteretic power converter of claim 1, wherein the hysteretic power converter comprises a buck converter.

4. The hysteretic power converter of claim 1, wherein the hysteretic power converter comprises a boost converter.

5. The hysteretic power converter of claim 2, wherein the calibration circuit further comprises a voltage divider configured to divide a charge pump voltage and to supply a divided output voltage as the calibrated voltage.

6. The hysteretic power converter of claim 2, wherein the calibration circuit further comprises a voltage clamp configured to limit the calibrated voltage.

7. The hysteretic power converter of claim 2, wherein the calibration circuit further comprises a low pass filter configured to average the feedback voltage.

8. The hysteretic power converter of claim 2, wherein the charge pump comprises at least a switch and at least a current source.

9. A method of controlling a hysteretic power converter, comprising:
a feedback node supplying a feedback voltage representing at least a portion of an output voltage of the hysteretic power converter to a calibration circuit and a first input of a first comparator in the hysteretic power converter, wherein the output voltage is applied at a first load terminal, wherein the feedback node is coupled to a second load terminal, and wherein a capacitor is coupled to the first load terminal and the second load terminal;
the calibration circuit supplying a calibrated voltage processed from the feedback voltage to a second input of the first comparator; and
the first comparator generating, in response to a difference between the calibrated voltage processed from the feedback voltage and the feedback voltage, an output signal at a logic 1 or a logic 0 for controlling the output voltage, wherein the first comparator is a hysteretic comparator.

10. The method of claim 9, further comprising:
a second comparator in the calibration circuit receiving the feedback voltage;
the second comparator comparing the feedback voltage to a reference voltage; and
supplying a calibration comparator output voltage.

11. The method of claim 9, further comprising:
a voltage clamp in the calibration circuit limiting the calibrated voltage.

12. The method of claim 9, further comprising:
a low pass filter in the calibration circuit averaging the feedback voltage.

13. The method of claim 10, further comprising:
controlling a charge pump in the calibration circuit according to the calibration comparator output voltage; and
the charge pump supplying a charge pump voltage for the calibrated voltage.

14. The method of claim 13, further comprising:
a voltage divider in the calibration circuit dividing the charge pump voltage; and
supplying a divided charge pump voltage as the calibrated voltage.

15. An integrated circuit including a hysteretic power converter, the hysteretic power converter comprising:
an output node arranged to have an output voltage at a first load terminal;
a first comparator having a first input arranged to receive, from a feedback node, a feedback voltage representing at least a portion of the output voltage, wherein the feedback node is coupled to a second load terminal;
a capacitor coupled to the first load terminal and the second load terminal;
at least one switch coupled to an output of the first comparator, the at least one switch further coupled to the output node and configured to control the output voltage;
a calibration circuit; and
a second comparator outside the calibration circuit, the second comparator configured to receive the feedback voltage and compare the feedback voltage to a first reference voltage, the second comparator having an output coupled to the at least one switch, wherein
the calibration circuit is configured to receive the feedback voltage and supply a calibrated voltage to a second input of the first comparator based on the feedback voltage, and
the first comparator and the second comparator are configured to control the at least one switch together, based on the calibrated voltage, the first reference voltage and the feedback voltage.

16. The integrated circuit of claim 15, wherein the calibration circuit comprises a third comparator configured to receive the feedback voltage, compare the feedback voltage to a second reference voltage, and provide a calibration comparator output voltage.

17. The integrated circuit of claim 15, wherein the at least one switch comprises a first switch and a second switch, the first and second switches coupled to the output node,
the integrated circuit further comprising first and second latches configured to control the corresponding first and second switches, each of the first and second latches having
a first input coupled to the output of the first comparator,
a second input coupled to the output of the second comparator, and
an output coupled to the corresponding first or second switch.

18. The integrated circuit of claim 16, wherein the calibration circuit further comprises a charge pump coupled to an output of the third comparator, the charge pump configured to supply a charge pump voltage according to the calibration comparator output voltage.

19. The integrated circuit of claim 18, wherein the calibration circuit further comprises:
   a voltage divider configured to divide the charge pump voltage and supply a divided charge pump voltage as the calibrated voltage, and
   a voltage clamp configured to limit the calibrated voltage.

20. The integrated circuit of claim 19, wherein the calibration circuit further comprises a low pass filter configured to average the feedback voltage supplied to the third comparator.

* * * * *